United States Patent
Snijders

[11] Patent Number: 6,139,239
[45] Date of Patent: Oct. 31, 2000

[54] SYSTEM FOR TRANSFERRING WAFERS FROM CASSETTES TO FURNACES AND METHOD

[75] Inventor: Gert-Jan Snijders, Amersfoort, Netherlands

[73] Assignee: ASM International N.V., Bilthoven, Netherlands

[21] Appl. No.: 09/404,222

[22] Filed: Sep. 23, 1999

Related U.S. Application Data

[63] Continuation of application No. PCT/NL98/00167, Mar. 25, 1998.

[51] Int. Cl.[7] .............................. H01L 21/22; F27D 3/12; B65B 5/02
[52] U.S. Cl. .......................... 414/160; 414/940; 432/241; 454/187
[58] Field of Search .................................... 414/160, 940; 432/241; 454/187

[56] References Cited

U.S. PATENT DOCUMENTS

| | | | |
|---|---|---|---|
| 4,375,354 | 3/1983 | Henriksson | 432/241 X |
| 4,938,691 | 7/1990 | Ohkase et al. | 432/241 X |
| 4,976,613 | 12/1990 | Watanabe | 414/940 X |
| 4,981,436 | 1/1991 | Wantanabe | 432/241 |
| 5,131,842 | 7/1992 | Miyazaki et al. | 432/241 |
| 5,163,832 | 11/1992 | Ishii et al. | 432/241 X |
| 5,431,600 | 7/1995 | Murata et al. | 414/940 X |
| 5,788,458 | 8/1998 | Bonora | 414/940 X |

*Primary Examiner*—Steven A. Bratlie
*Attorney, Agent, or Firm*—Knobbe, Martens, Olson & Bear LLP

[57] ABSTRACT

System for treating wafers. It is proposed to place a number of furnaces in one area and wafer racks filled with wafers are introduced into each of these furnaces. The wafer racks are located in trolleys which are filled from cassettes in a central loading/removal device. The central loading/removal device serves for all furnaces.

19 Claims, 5 Drawing Sheets

SYSTEM FOR TRANSFERRING WAFERS FROM CASSETTES TO FURNACES AND METHOD

This application is a continuation of PCT/NL98/00167, filed Mar. 25, 1998.

FILD OF THE INVENTION

The invention relates to a system for treating wafers.

BACKGROUND OF THE INVENTION

When treating semiconductor discs or wafers, the latter are, in the prior art, placed in wafer racks, which wafer racks are introduced into furnaces and a treatment at elevated temperature then takes place, with any type of process gas being supplied. In U.S. Pat. No. 5,407,449, which was assigned to ASM International N.V., a system is described in which the wafers are supplied in the conventional manner in cassettes. The wafers are removed from the cassettes by a central robot and transferred to the wafer racks for the furnace concerned. The wafer racks are fed to the furnace via a carousel. Each cluster consisting of a furnace and other treatment devices has its own loading and removal device.

When increasing the capacity of devices for the treatment of wafers it was first proposed in the prior art to place a number of such systems parallel to one another.

In a subsequent proposal, two furnaces were placed in one area and these furnaces were provided with wafers originating from cassettes with the aid of a single robot.

The problem when designing such systems is that the robots for transferring wafers from cassettes to wafer racks have to be so dimensioned that the time for transfer of the wafers does not constitute a limiting factor, even for the shortest treatment time in the furnaces. One solution to this problem comprises positioning a number of robots above one another for simultaneous loading of a wafer rack.

In practice, however, it is found that the capacity of such robots is seldom used to the full. Moreover, the installation costs for a large number of robots are appreciable, as is the space requirement.

U.S. Pat. No. 5,178,639A discloses a vertical heat-treating apparatus, comprising a number of adjacent furnaces. Supply of wafer filled wafer racks is realized through a single supply rail along which the displacement device is transferable between each of the furnaces and a central loading/unloading area. The displacement device comprises a simple pedestal for the wafer racks.

SUMMARY OF THE INVENTION

An object of the present invention is to overcome these drawbacks and to provide a solution, which provides a larger number of wafers, and which provides sufficient capacity for transferring wafers from cassettes to the wafer racks, wherein the transfer capacity is utilized to the greatest possible extent.

Another object of the present invention is to control the conditions of transport of wafers in a system for treating wafers. A system for treating wafers includes at least two furnaces for processing the wafers, a loading/removal station for transferring cassettes to and from racks, and a plurality of trolleys for receiving the wafers. The loading/removal station includes a plurality of loading/removal spaces. The trolleys are movable between the loading/removal station and the furnaces. Each trolley has a holder and includes lifting means for lifting and holding a wafer rack during transfer of wafers from the cassettes to the wafer rack at the loading/removal station, for lowering the wafer rack into the holder during transport and for lifting the wafer rack into a furnace at one of the furnace positions and vice versa.

The insight on which the invention is based is that transfer from cassettes to wafer racks is no longer carried out in a cluster with the furnaces but in a location located some distance therefrom. As a result it is possible for the central loading/removal station to serve various furnaces arranged in one are. There can be three, but also thirty, furnaces. Because the maximum capacity of all furnaces is never reached at the same time, it is possible to choose a peak capacity for the central station for loading/removal which is appreciably lower than the peak capacity determined for the loading/removal devices according to the prior art. As a result, on the one hand a saving in costs and on the other hand a saving in space are obtained. The latter results not only in limitation of the fixed costs but also makes it possible to realize the various features under clean room conditions.

According to the invention, the holder described above is provided with a detachable lid. As a result it is possible to create an atmosphere in said holder which is protective in relation to the environment. These conditions can approximate to or can even be clean room conditions. It is also possible to introduce an inert gas into the holder, or, with the aid of a blower, to move clean air or other gas through the holder during transport. It is also possible to pump out the contents of the holder.

For transport of the wafer racks between the central stations and the furnaces it is important that no particles are liberated during such transport as a result of movement of the wafers with respect to the wafer racks. To this end it is proposed to raise the wafers somewhat from the wafer racks with the aid of, preferably, plastic fingers, during transport. Only when the wafer racks are loaded into the furnace, that is to say when the temperature rises, do the wafer racks again take over the support function for the wafers.

By this means the plastic fingers are always subjected to low temperature stresses and the production of particles is prevented as far as possible. Working under clean conditions is further promoted if, during transport, a lid is fitted on the device for transporting wafer racks. By this means said device is completely shut off during movement between the central station and the furnaces. It is possible to design the construction such that at the furnace the device is brought into sealed engagement with the bottom of the furnace and the lid fitted on the device is then moved into a separate chamber provided for this purpose below the furnace. Such a chamber can also serve to receive the closure for the furnace which is removed to expose the opening for introduction of the wafer racks.

As is disclosed in the prior art, it is possible to provide the bottom of the wafer racks with a closure plate for the furnace, so that when a wafer rack is introduced into the furnace closure is automatically provided.

It is particularly efficient to effect simultaneous removal of the closure from the furnace and the lid from the device for transporting wafer racks. With this procedure the top of the lid of the device and the bottom of the closure for the furnace can be shielded from the environment as far as possible, so that any contaminants adhering thereto are prevented from passing into the environment.

The device for moving the wafer racks is provided with lifting means for the wafer racks, on the one hand for filling the wafer racks and, on the other hand, for introducing the wafer racks into the furnace. Furthermore, there are lifting means at the furnace for bringing the device for transporting wafer racks into sealed contact with the bottom of the furnace.

The invention also relates to a method for treating wafers, comprising feeding said wafers in cassettes to a central loading/removal station, taking said wafers out of said cassettes and placing them in wafer racks, loading said wafer racks into a device for transporting wafer racks, moving said device to one of a multiplicity of furnaces, transferring said wafer racks filled with wafers into one of said furnaces, subjecting the wafers to a heat treatment, discharging said wafers stored in the wafer racks into a device for transporting wafer racks, moving said device to the loading/removal station and transferring said wafers from said wafer racks to cassettes.

BRIEF DESCRIPTION OF THE DRAWINGS

The invention will be explained in more detail below with reference to an illustrative embodiment shown in the drawing. In the drawing.

DETAILED DESCRIPTION OF THE INVENTION

Figure 1:
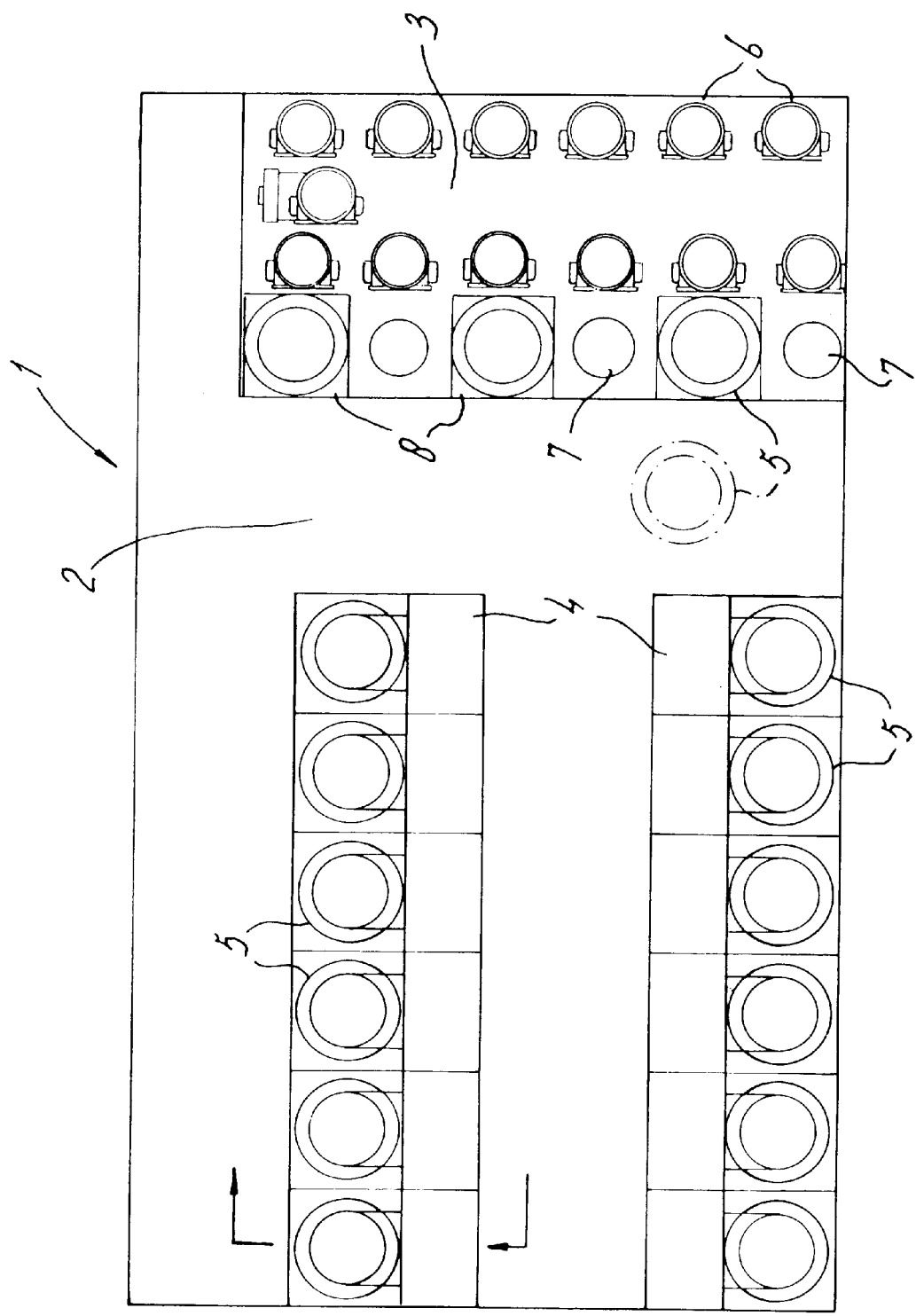
FIG. 1 shows, diagrammatically, a top view of the system according to the invention.

In FIG. 1 the system according to the present invention is indicated in its entirety by 1. The system consists of room 2 and transfer system 3. Room 2 can be operated under clean room conditions. However, it is also possible for standard conditions to prevail in the room.

A number of furnaces for treating wafers at elevated temperature, for example by supplying a gas under those conditions, are arranged in room 2. Wafer racks filled with wafers are introduced into said furnaces. Such wafer racks are arranged in trolleys 5, which are transported from the loading/removal station arranged in area 3 to the furnaces 4. Loading/unloading of trolleys 5 takes place in bays 8. Those bays can be opened to and shut off from both clean room 2 and area 3.

In the loading/removal station the wafers are supplied packed in cassettes. In the prior art such cassettes are the conventional transport means with which wafers are moved over both short and long distances. The wafers are then removed from the cassettes with the aid of robots 7 and placed in wafer racks, which are mounted in trolleys 5. These trolleys 5 are then driven beneath faces 4, after which the wafer racks are placed in furnaces 4 in the manner which will be described below, for the treatment described above.

Following such a treatment, the trolleys 5 are moved back to the loading/removal station, i.e. into the bay 8, and the wafers are replaced in the cassettes 6.

It is, of course, possible, following treatment in one of the furnaces 4, to subject the wafers to a further treatment in one of the other furnaces 4. On the one hand this can comprise a continuation of the earlier treatment, but it is also possible to use a different gas or another temperature regime in another furnace.

In contrast to the prior art, with this construction it is no longer necessary to use an air lock connected in series to each furnace. That is to say, the loading/removal station described above can be constructed with a capacity such that all furnaces can be in full operation at all times. In practice, such a capacity is found to be many times smaller than the capacity of lock constructions connected in series for each furnace, which capacity is usually utilized to a very limited extent. After all, with this arrangement the lock will generally not be operative during the heat treatment in the furnace. Furthermore, with this construction it is possible to determine the peak load on the basis of the peak load for all furnaces together and not for each of the furnaces individually, which also results in it being possible for the loading/removal station in area 3 to be constructed with a more limited capacity. Because a more limited construction of the loading/removal station is possible, the installation costs thereof will decrease, whilst the floor area taken up is also reduced.

Figure 2:
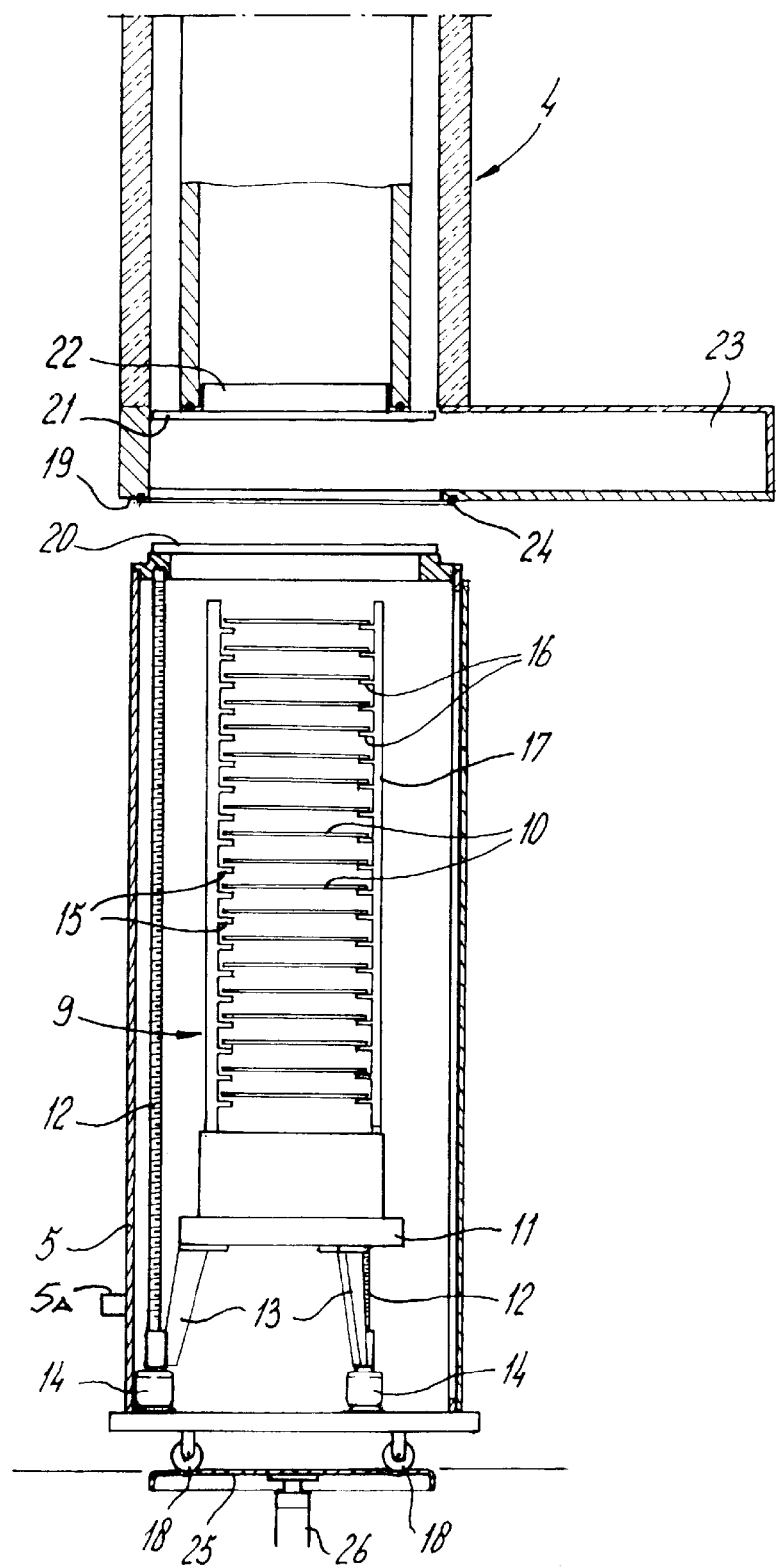
FIG. 2 shows, diagrammatically, a cross-section of the trolley according to the invention when moving beneath a furnace.
Figure 3:
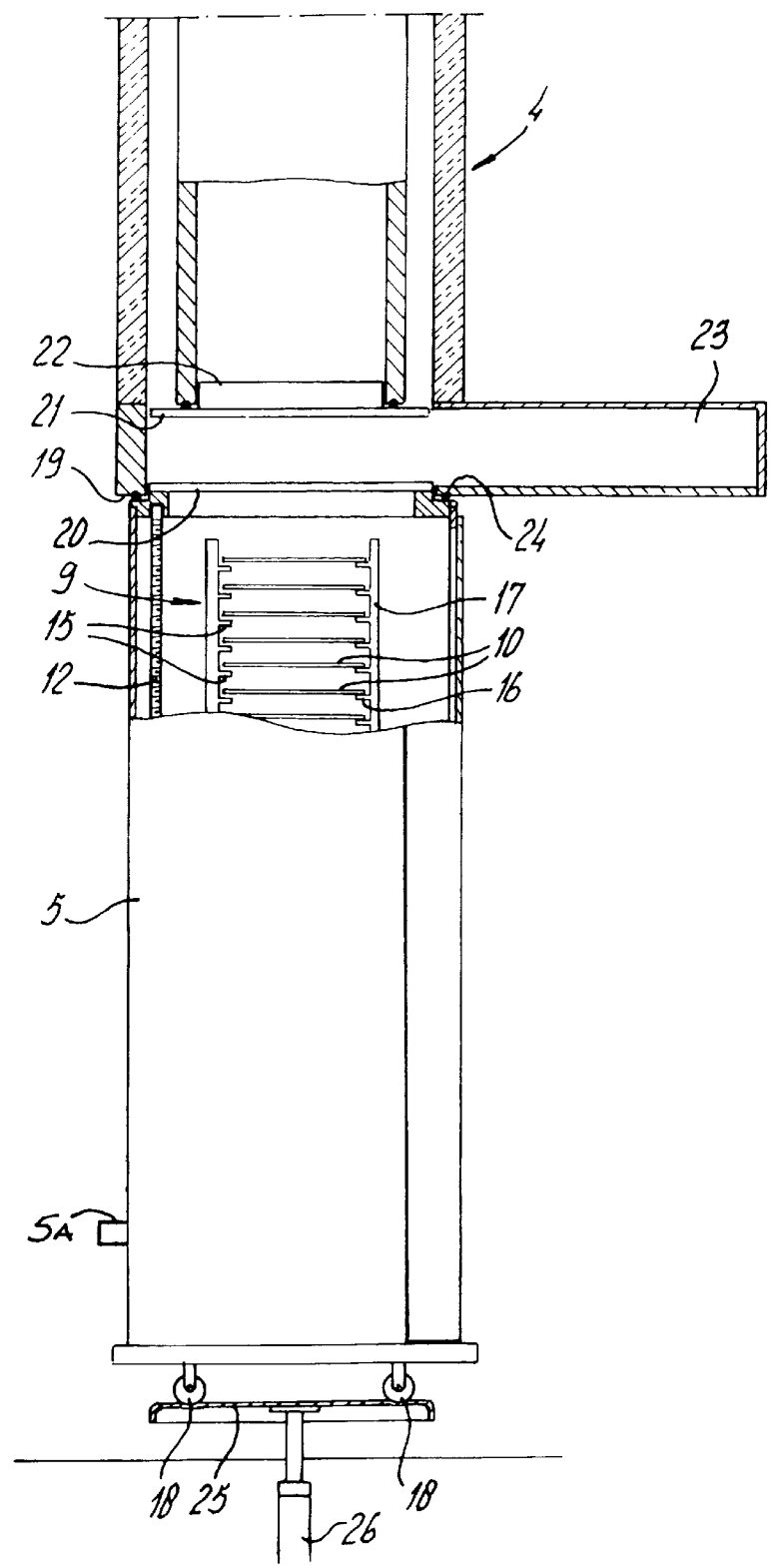
FIG. 3 shows the trolley according to FIG. 2 when coupling to the furnace.
Figure 4:
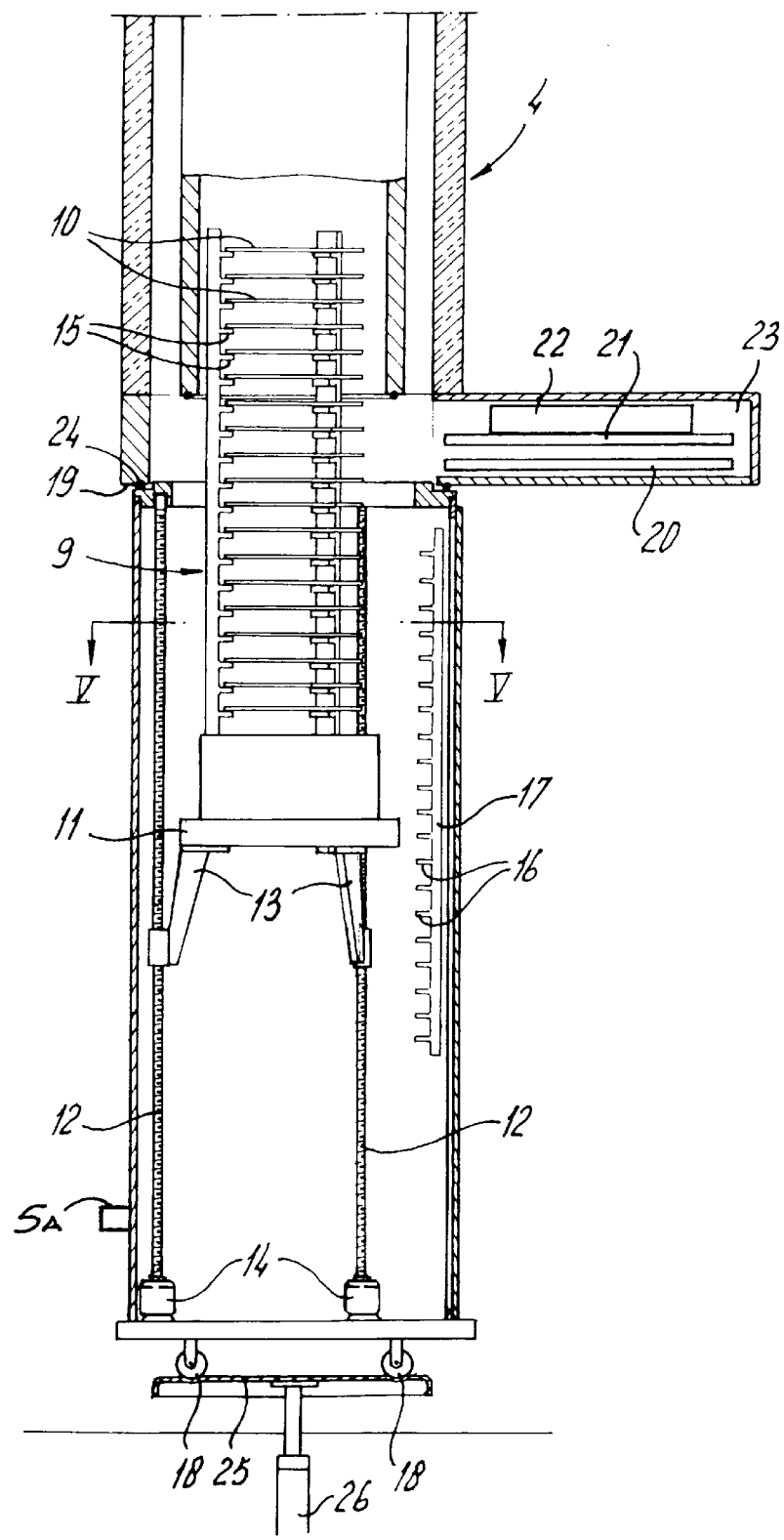
FIG. 4 shows the trolley according to FIG. 2 when introducing the wafer rack.

FIGS. 2–4 show a side view, diagrammatically in cross-section, of the trolley 5 shown in FIG. 1. This trolley comprises a holder-like part, which is mounted on wheels 18 and is provided at the top with a lid 20. Three lift spindles 12, between which a lift support 13 extends, are mounted in the trolley. The lift support 13 can be moved up and down by means of the lift spindles. Rotation of the lift spindles is effected with the aid of lift motors 14. The construction of the lift is shown diagrammatically only and it must be understood that any construction known in the prior art can be used. The lift support is equipped to receive wafer rack 9. Wafer rack 9 consists of a top section on which the actual rack of quartz material is mounted, the latter being provided with quartz supports 15 for carrying wafers 10. A closure plate 11 is fitted at the bottom of the wafer rack 9.

When loading trolley 5 in bay 8, lift support 13 will be in a position such that the uppermost quartz supports 15 project above the trolley. When filling with the aid of robot 7, the wafer rack will then be moved slowly upwards out of the trolley and after it has been completely filled the wafer rack will be lowered. Lid 20 will then be fitted. The conditions within the trolley 5 can then be modified, in a manner which is not shown, such that clean room conditions are produced therein. It is also possible to introduce an inert gas via an inlet 5a or continually to ventilate the interior of trolley 5.

Figure 5:
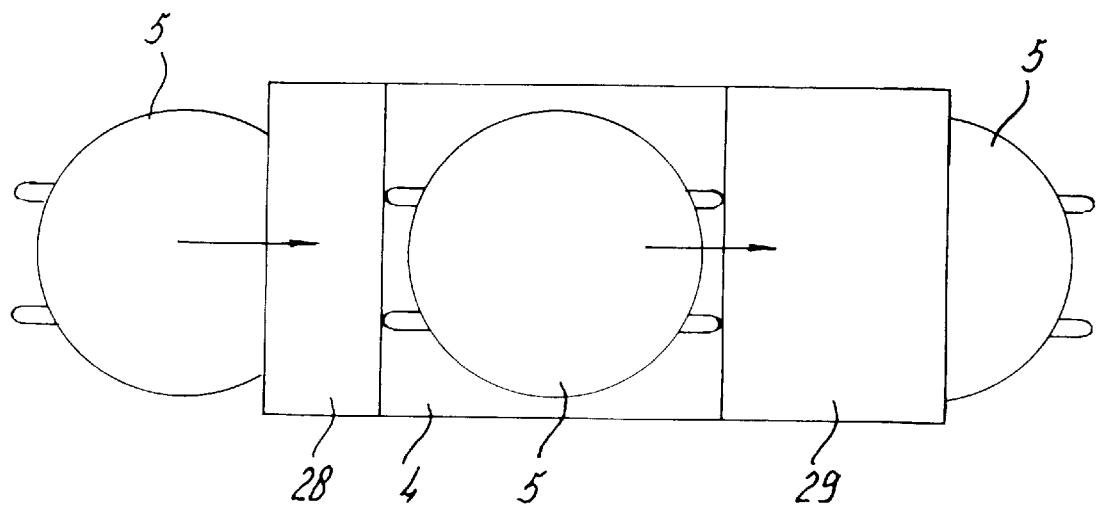
FIG. 5 shows a cross-section along the line VI—VI in FIG. 2.

After wafer rack 9 has been brought fully into trolley 5, supports 16 fixed to bearers 17 are moved inwards beneath the wafers 10, which rest on the quartz supports 15 (see also FIG. 5). The bearers 17 with the plastic supports 16 are then moved upwards so that the wafers now rest on the plastic supports 16. Transport can then take place without there being a risk that particles will be produced as a result of movement of the wafers with respect to the quartz supports 15.

Trolley 5 is then moved, in a manner which is not shown in more detail, beneath furnace 4, as is shown in FIG. 3. This movement can be effected by hand, but it is also possible to automate the various features. It is not absolutely essential for trolley 5 to run on wheels 18. Any construction known in the prior art for bringing a trolley 5 from bay 8 to furnace 4 can be used.

It can be seen from FIG. 2 that furnace 4 is arranged at a height such that trolley 5 can be driven beneath it. A lift platform 25, which can be operated by jack 26, is located beneath the opening of furnace 4. By this means trolley 5 can be pressed against the bottom 19 of the furnace 4, as is shown in FIG. 3. Either trolley 5 or furnace 19 is provided with an O-ring seal 24, enabling the two to be sealed against one another. Furnace 4 is provided at the bottom thereof with a furnace closure 21 provided with an insulation plug 22. This closure is brought down, in a manner which is not shown in more detail, until it comes into contact with lid 20.

Lid 20 is then gripped, in a manner which is not shown in more detail, by furnace closure 21 and furnace closure 21, together with lid 20, moves slightly upward.

The set consisting of furnace closure 21 and lid 20 then moves to the right, as is shown in FIG. 4, into chamber 23. In this way it is ensured that any contaminated material present on the bottom of furnace closure 21 or on the top of lid 20 is enclosed and does not disseminate. After the set consisting of furnace closure 21 and lid 20 has moved completely into chamber 23, the wafer rack 9 can be moved into the furnace. To this end it is first necessary that the wafers come to rest on the quartz supports 15 of the wafer rack 9. To this end the bearers 17 for the plastic supports are moved a little downwards and the plastic supports 16 are then moved outwards. The plastic supports then remain in this position. The lift support 13 is then moved upward by operating motors 14, so that the wafer rack enters the furnace. This movement is continued until closure plate 11 closes off the furnace from below, after which the relevant process can be carried out.

Figure 6:
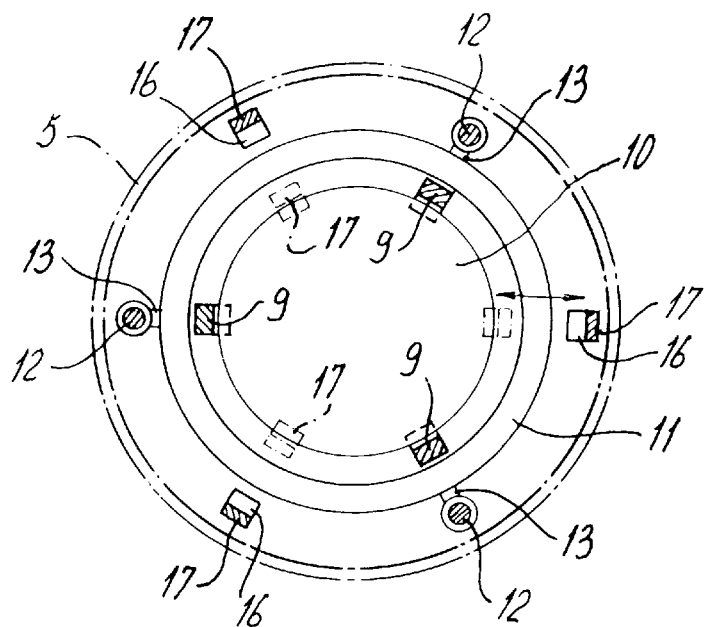
FIG. 6 shows, diagrammatically, a top view of the passage through a furnace.

The operations described above are then carried out in reverse order. After closing trolley 5 with lid 20, it is possible to move the trolley back in the same direction, but it also possible to move the trolley straight on as is shown in FIG. 6. As a result a new trolley 5 can be positioned beneath the furnace 4 straight away, so that the capacity of the system is increased as far as possible.

In FIG. 6 the electronics part of furnace 4 is indicated by 28, whilst 29 indicates the gas control devices for the process. It can be seen from this figure that the trolley 5 is moved under the furnace from left to right.

It will be understood that in the case of a simple embodiment of the system described above the trolleys 5 will be moved back in the same direction as that from which they were introduced.

Although the invention has been described above with reference to a preferred embodiment, it will be understood that numerous possibilities exist for adapting the concept described above to modifications which are obvious to those skilled in the art and which fall within the scope of the appended claims. For instance, it is possible to provide chamber 23 with a closeable lid which interacts with the lid 20 of the trolley. In this way the interior of the furnace 4 can be completely isolated from the environment so that optimum treatment conditions can be maintained within the furnace in a simple manner. Such a lid is removed together with lid 20 only after connecting trolley 5 to furnace 4, so that the ingress of contaminants is essentially prevented. Lid 21 can be removed from the furnace tube subsequently or at the same time.

What is claimed is:

1. A system for treating wafers, comprising:
   at least two furnaces for processing said wafers;
   a loading/removal station for transferring cassettes to wafer racks and vice versa, the station comprising a plurality of loading/removal spaces; and
   a plurality of trolleys for receiving said wafer racks loaded with a plurality of wafers and being movable between said loading/removal station and said furnaces, each of said trolleys comprising a holder and comprising lifting means for lifting and holding a wafer rack during transfer of wafers from the cassettes to the wafer rack at the loading/removal station, for lowering the wafer rack into the holder during transport and for lifting the wafer rack into a furnace and vice versa.

2. The system according to claim 1, wherein each furnace has a chamber which has an opening for receiving, in a sealable manner, a trolley, the chamber having a section that extends laterally from the opening.

3. The system according to claim 2, wherein said section of the chamber is configured to receive a lid from said holder.

4. The system according to claim 2, wherein said section of the chamber is configured to receive a closure for the furnace.

5. The system according to claim 3, wherein said section of the chamber is configured to receive the lid of said holder and a closure of said furnace, wherein the lid of said holder and the closure of said furnace are placed against one another and simultaneously movable.

6. The system according to claim 2, wherein the wafer rack is provided at a bottom with a plate which forms a closure plate of said furnace when the wafer rack is introduced into the furnace.

7. The system according to claim 1, wherein the central loading/removal station is arranged in a clean room.

8. The system according to claim 7, wherein an area between the loading/removal station and the furnaces in which the trolley is moved comprises a clean room.

9. The system according to claim 1, wherein the at least two furnaces, the loading/removal stations, and the plurality of trolleys are arranged in a clean room.

10. A device for moving wafer racks loaded with a plurality of wafers, comprising:
    a holder having a base and vertical walls, the holder being provided with transport means and a support for at least a bottom of a wafer rack being mounted in said holder; and
    means for simultaneously engaging said plurality of wafers during transport and displacing said wafers from said wafer racks so that transport can take place without particles being produced, the means for engaging and displacing being positioned near an interior wall of said holder.

11. The device according to claim 10, wherein said holder has a detachable lid.

12. The device of claim 10, wherein said holder is connectable to means for influencing conditions prevailing within said holder.

13. The device according to claim 10, wherein said holder is provided with lifting means for moving a wafer rack mounted therein.

14. The device according to claim 10, wherein said transport means comprise wheels.

15. A method of furnace treating wafers, comprising:
    feeding a plurality of said wafers in cassettes to a central loading/removal station;
    removing said plurality of wafers from said cassettes and loading them in wafer racks;
    loading said wafer racks into a device for displacement of wafer racks;
    simultaneously engaging each wafer by engaging means and displacing said wafers from supports of said wafer racks;

moving said device to one of a plurality of treatment furnaces whilst keeping each wafer displaced from said supports;

returning the wafers onto said supports of said wafer rack and releasing the wafers from the engaging means;

transferring said wafer racks filled with said plurality of wafers into one of said treatment furnaces;

subjecting said plurality of wafers to a treatment at elevated temperature;

discharging said plurality of wafers stored in said wafer racks into the device for displacement of wafer racks; and removing said device.

16. The method according to claim 15, wherein said device for displacing wafer racks remains during processing of the wafers in the treatment device near said treatment device.

17. The method according to claim 15, wherein said wafers are displaced upwardly relative to said wafer racks during transport in said device for displacing of wafer racks to be freed therefrom.

18. The method according to claim 15, wherein after discharge from said treatment furnace said device for transporting wafer racks is moved to another treatment furnace for a further treatment of said wafers.

19. The method of claim 5, further comprising using a plurality of devices for displacing of wafer rack and moving said devices from a plurality of spaces of a central loading/removal station.

* * * * *

UNITED STATES PATENT AND TRADEMARK OFFICE
CERTIFICATE OF CORRECTION

PATENT NO.   : 6,139,239
DATED        : October 31, 2000
INVENTOR(S)  : Snijders et al.

It is certified that error appears in the above-identified patent and that said Letters Patent is hereby corrected as shown below:

Column 5,
Line 63, change "cassettes" to -- wafers from cassettes --.

Column 8,
Linr 11, change "claim 5" to -- claim 15 --.

Signed and Sealed this

Twenty-sixth Day of February, 2002

Attest:

JAMES E. ROGAN
Attesting Officer    Director of the United States Patent and Trademark Office